United States Patent [19]

Ashby et al.

[11] Patent Number: 4,648,936

[45] Date of Patent: * Mar. 10, 1987

[54] DOPANT TYPE AND/OR CONCENTRATION SELECTIVE DRY PHOTOCHEMICAL ETCHING OF SEMICONDUCTOR MATERIALS

[75] Inventors: Carol I. H. Ashby, Edgewood; James L. Dishman, Albuquerque, both of N. Mex.

[73] Assignee: The United States of America as represented by the United States Department of Energy, Washington, D.C.

[*] Notice: The portion of the term of this patent subsequent to Mar. 10, 2004 has been disclaimed.

[21] Appl. No.: 786,563

[22] Filed: Oct. 11, 1985

[51] Int. Cl.[4] .......................................... H01L 21/306
[52] U.S. Cl. .................................... 156/643; 156/646; 156/655; 156/662
[58] Field of Search ............................ 29/569 L, 580; 204/192 E; 156/643, 646, 655, 662

[56] References Cited

U.S. PATENT DOCUMENTS

| | | | |
|---|---|---|---|
| 4,252,891 | 2/1981 | Kostyshin et al. | 430/323 |
| 4,320,191 | 3/1982 | Yoshikawa et al. | 430/323 |
| 4,414,059 | 11/1983 | Blum et al. | 156/643 |
| 4,478,677 | 10/1984 | Chen et al. | 156/643 |

OTHER PUBLICATIONS

Smolinsky et al., "Plasma Etching . . . Oxides", J. Vac. Sci. Techn. 18, 12–16 (1981).
Greene, "Preferential Photoelectrochemical . . . Etches", Proc., 6th Intern Symp on Gallium Arsenide . . . , Edingurgh, 141–149 (1976).
Hoffman et al., "Voltage-Controlled Photoetching of GaAs", Appl. Phys. Lett. 38, 564–6 (1981).
Haisty, "Photoetching and Plating of GaAs", J. Electrochem. Soc. 108, 790–4 (1961).
Kuhn-Kuhnenfeld, "Selective Photoetching of GaAs", J. Electrochem. Soc. 119, 1063–8 (1972).
Osgood, Jr., "Localized Laser Etching . . . ", Appl. Phys. Lett., 40, 391–3 (1982).
Hackett, Jr., "A Scanning Electron . . . Diodes", J. Electrochem. Soc. 119, 973–6 (1972).
Poulsen, "Plasma Etching . . . A Review", J. Vac. Sci. Techn. 14, 266–74 (1977).

*Primary Examiner*—Ivars Cintins
*Attorney, Agent, or Firm*—Armand McMillan; Albert Sopp; Judson R. Hightower

[57] ABSTRACT

A method of selectively photochemically dry etching a first semiconductor material of a given composition in the presence of a second semiconductor material which is of a composition different from said first material, said second material substantially not being etched during said method, comprises subjecting both materials to the same photon flux of an energy greater than their respective direct bandgaps and to the same gaseous chemical etchant under conditions where said etchant would be ineffective for chemical etching of either material were the photons not present, said conditions also being such that the resultant electronic structure of the first semiconductor material under said photon flux is sufficient for the first material to undergo substantial photochemical etching under said conditions and being such that the resultant electronic structure of the second semiconductor material under said photon flux is not sufficient for the second material to undergo substantial photochemical etching under said conditions.

In a preferred mode, the materials are subjected to a bias voltage which suppresses etching in n- or p- type material but not in p- or n-type material, respectively; or suppresses etching in the more heavily doped of two n-type or two p-type materials.

22 Claims, No Drawings

DOPANT TYPE AND/OR CONCENTRATION SELECTIVE DRY PHOTOCHEMICAL ETCHING OF SEMICONDUCTOR MATERIALS

The U.S. Government has rights in this invention pursuant to Contract No. DE-AC04-76DP00789 between the U.S. Department of Energy and AT&T Technologies, Inc.

CROSS REFERENCE TO RELATED APPLICATION

This application is related to U.S. Ser. No. 786,560 filed on even date, and which disclosure is incorporated by reference herein.

BACKGROUND OF THE INVENTION

This application relates to a new dry technique for selectively photoetching a desired semiconductor material in the presence of other semiconductor materials. In a preferred embodiment, all materials have III-V compositions.

Conventional dry etching processes for semiconductors, e.g., of the III-V-group involve Cl• or Cl— as the gas phase, "dry" reactant (G. Smolinsky et al, "Plasma Etching of III-V Compound Semiconductor Materials and Their Oxides", *J. Vac. Sci. Technol.* 18 (1981), 12–16). In the absence of light, these processes often do not exhibit significant or useful selectivity among III-V or other materials, especially when materials differ primarily only in dopant concentration or type (n- or p-). Since many semiconductor device structures involve layers of material which differ in dopant concentrations by a factor of 10 or less or differ in type, it would be extremely useful if one could selectively etch material of one doping level or type. Unfortunately, no etching process which permits such a high degree of selectivity has been reported before now.

Dopant, concentration dependent, wet etching based on variations in sample bias voltage have been observed for Si (W. Kern, "Chemical Etching of Silicon, Germanium, Gallium Arsenide, and Gallium Phosphide", *RCA Review* 39 (1978) 278–308). For Si, a difference of two orders of magnitude in dopant concentration is required to produce useful differences in etch rate. Dopant concentration dependent wet etching of n-GaAs also has been observed (P. D. Greene, "Preferential Photoelectrochemical Dissolution of n-GaAs in Fe(III)-based Etches", *Proc. 6th Int. Symp. on Gallium Arsenide and Related Compounds*, Edinburgh, Sept. 20–22, 1976, p. 141–149). See also Kerr, supra. However, a difference of three orders of magnitude in dopant concentration was employed, and application of an external bias voltage to provide etching control was not employed. Voltage control of the rate of a wet etching process for n-GaAs has been reported (H. J. Hoffman et al., "Voltage-controlled Photoetching of GaAs", *Appl. Phys. Lett.* 38 (1981) 564–566), but no dopant concentration selective etching was involved.

Several photochemical wet etching processes have been identified which produce preferential etching of n-type materials (R. W. Haisty, "Photoetching and Plating of Gallium Arsenide", *J. Electrochem. Soc.* 108, 790–4 (1961); F. Kuhn-Kuhnenfeld, "Selective Photoetching of Gallium Arsenide", *J. Electrochem. Soc.* 119, 1063–8 (1972); and R. M. Osgood, Jr., "Localized Laser Etching of Compound Semiconductors in Aqueous Solution", *Appl. Phys. Lett.* 40, 391–3 (1982)). A photochemical preferential wet etchant for p-GaP has been reported (W. H Hackett, Jr., et al., "A Scanning Electron Microscope Investigation of Etching Phenomena in GaP Electroluminescent Diodes", *J. Electrochem. Soc.* 119, 973–6 (1972)). However, no dopant-type or concentration selective, dry etching processes for semiconductor materials have been reported.

Such dopant concentration or type-selective dry etching processes would be extremely useful in the fabrication of semiconductor devices (especially III-V devices where the problem is most severe) since dry processes offer several well-known advantages over wet processes for commercial production (R. G. Poulsen, "Plasma Etching in Integrated Circuit Manufacture-A Review", *J. Vac. Sci. Technol.* 14, 266–74 (1977)).

Many conventional processes are known for etching a wide variety of substrates and for photopatterning substrates using photoresists and other techniques. However, the details of the etching steps of these methods are unrelated to the problem of selectively etching semiconductor substrates according to dopant-type or dopant concentration. As a sampling, see, e.g., U.S. Pat. Nos. 4,478,677; 4,414,059; 4,320,191; and 4,252,891. Similarly unrelated is U.S. Pat. No. 4,404,072 disclosing a photoelectrochemical wet etching technique. No selective etching between different semiconductor materials is reported. Similar disclosures involving details of etching techniques which do not achieve any selection between semiconductor materials also include U.S. Pat. Nos. 4,351,706; 4,454,004; 3,364,087; 4,326,911; and 4,331,504.

Although some of the very basic aspects of dry etching processes are known, e.g., the relationship between bandgap and photon energies in photochemical etching of Si by $XeF_2$ (Houle—"Non-thermal Effects in Laser-Enhanced Etching of Si by $XeF_2$", *Chem. Phys. Lett.* 95 (1983) 5–8), selective dry etching techniques have not been disclosed heretofore.

All of the disclosures cited above are incorporated by reference herein.

SUMMARY OF THE INVENTION

Accordingly, it is an object of this invention to provide a method for the selective dry etching of one semiconductor material in the presence of another.

It is another object of this invention to provide such a selective technique for etching a semiconductor material of one type in the presence of a semiconductor material of another type.

It is yet another object of this invention to provide such a selective process for dry etching of a semiconductor material having a certain dopant concentration of a given type in the presence of another semiconductor material having a different dopant concentration of the same type.

It is a further object of this invention to provide such a selective dry etching process which incorporates the advantages known for dry etching processes over wet etching processes and which achieves selectivity with minimized suppression of the etching rate in the semiconductor material which undergoes the preferential dry etching.

Upon further study of the specification and appended claims, further objects and advantages of this invention will become apparent to those skilled in the art.

These objects have been attained by providing a method of selectively photochemically dry etching a first semiconductor material of a given composition in the presence of a second semiconductor material which is of a composition different from said first material, said second material not being etched during said method, comprising subjecting both materials to the same photon flux of an energy greater than their respective direct bandgaps and to the same gaseous chemical etchant under conditions where said etchant would be ineffective for chemical etching of either substrate were the photons not present, said conditions also being such that the resultant electronic structure of the first semiconductor material under said photon flux is sufficient for the first material to undergo substantial photochemical etching under said conditions and being such that the resultant electronic structure of the second semiconductor material under said photon flux is not sufficient for the second material to undergo substantial photochemical etching under said conditions.

DETAILED DISCUSSION

A key discovery upon which this invention is based is the fact that the effect of light on the etching process of interest is essentially purely photochemical and not thermal in nature for appropriate low and moderate levels of irradiation. This fact was not heretofore known, especially in III-V semiconductor materials. Accordingly, it was not previously predictable that non-photochemical dry etching processes could be rendered selective based on controlled selection of semiconductor electronic properties, especially in III-V semiconductors. See, e.g., a publication of this aspect of the invention by Ashby, *Appl. Phys. Lett.*, 45 (8) Oct. 15, 1984, 892. In this application, the electronic properties which serve to provide the basis for selective etching are dopant-type (n or p) and/or dopant concentration. Using the principles of this invention, for the first time, selectivity in etching of 20:1 and more has been achieved for III-V materials differing by only a factor of 5 or less in dopant concentration. Also for the first time, a p-type III-V material has been preferentially etched over the corresponding n-type.

Although this invention is particularly applicable to the important class of III-V semiconductor materials, it is not limited to these materials (B, Al, Ga, In, Tl, N, P, As, Sb, Bi). It can be utilized in any systems where the principles discussed herein are applicable, including Group IV semiconductors (Si, Ge), II-VI semiconductors, II-IV semiconductors, combinations thereof, etc. While an important application is in the binary semiconductors, most notably GaAs, it is fully applicable to ternary, quaternary and higher semiconductor systems, including the well known families of $Al_{1-x}Ga_xAs$/GaAs, $Al_{1-x}Ga_xAs$, $GaAs_{1-x}P_x$/GaAs, $GaAs_{1-x}P_x$, $GaAs_{1-x}P_x$/GaP, or $In_{1-x}Ga_xAs$, and many others.

A key aspect of this invention is the maintenance in the etching process of conditions which ensure that dry (i.e., non-liquid, i.e., gaseous-etchant-based) photochemical (i.e., requiring both the gaseous, chemical etchant species and actinic radiation) etching is the predominant, essentially only or, in fact, only etching mechanism ongoing in the system of interest. The more exclusive is dry photochemical etching vis-a-vis other non-selective etching mechanisms, e.g., thermal-based or purely chemical-based etching, the higher will be the selectivity in accordance with this invention. Consequently, the ambient conditions of the semiconductor materials will be selected such that the active etchant species will not effectively etch the semiconductor materials in the absence of the applied actinic radiation, i.e., photon flux greater than the bandgap energy of at least the material to be etched. Often, in accordance with this invention, the materials involved will have essentially the same chemical compositions and hence bandgap; selectivity thus necessarily will be based on dopant-type or dopant concentration as discussed above. With respect to selective etching of semiconductor materials having different bandgaps, reference is made to commonly assigned, co-pending application Ser. No. 786,560, filed of even date.

Appropriate ambient conditions can readily be determined by one of skill in the art using routine preliminary experiments to determine the appropriate combination of parameters which will preclude non-photochemical etching, e.g., flow rates, vacuum levels, active etchant species (plasma) generation, identity and concentration, residence time of the active species on the semiconductor surface, flux and wavelength of the selected radiation to be applied, polarity and strength of the bias voltage applied to the semiconductor materials, size, geometrical and configurational details, apparatus, etc. A key factor is the selection of active species concentrations sufficiently low under the applied conditions that negligible purely thermal/chemical etching of the substrates occurs in the absence of the radiation of the selected flux. Whether some minimal amount of non-photochemical etching is tolerable will be application-selective and will be well known to those skilled in the art in view of the details and guidance of this disclosure.

In general, if the degree of photochemical etching is a factor of 100 greater than other etching mechanisms, the effects of the latter will be essentially negligible in this invention for most applications. However, photochemical/other etching mechanism ratios lower or higher than 100/1, of course, are also includable within the scope of this invention.

The identity of the etchant gaseous species is not per se critical and will be routinely selected by those of skill in the art in accordance with the chemical composition of the semiconductor materials of interest. Throughout this application, the term "dry etching" refers to gas/solid phase etching. For III-V semiconductors, the conventional (Cl•, Cl−) gaseous species are very suitable. Other halides (e.g., Br, I) are also suitable for these materials. For materials based on elements in other than III-V groups, appropriate etchants are similarly well known and applicable herein. See, e.g., the many references discussed and incorporated by reference above, as well as many others.

The wavelength of the actinic radiation will be selected such that the photon energy is greater than the direct bandgap of at least the semiconductor material in which etching is desired. As discussed above, under many of the more important applications of this invention, the bandgaps of the materials will be essentially the same, whereby the photon flux will not be a basis of selectively etching one over the other. In accordance with this invention, the photon flux in general provides no selectability but merely performs its known function of generating active species at the surface of the semiconductor materials, e.g., electron-hole pairs, which effectuate the etching reaction with the active chemical etching species. The wavelength must be selected to generate a sufficient concentration of such electronic species sufficiently quickly that the resultant degree of recombination of these active species in the semiconductor material is not so large that etching is precluded or unacceptably deleteriously affected. As a result, the wavelength generally must be chosen to correspond to that of the direct gap of the semiconductor material(s) and not, e.g., to that of the indirect gap. Of course, there is essentially no upper limit on the energy of the photons. However, the total fluence impinging on the semiconductor materials must not be so large that unacceptable damage results or other non-photochemical etching mechanisms are activated to unacceptable levels.

In general, under given atmospheric, electrical and configurational conditions, the photochemical etching rate for a given etchant will vary linearly with the photon flux. The magnitude of the flux per se is not critical and generally will be in the range of about 10 watts/cm$^2$ or lower to several thousand watts/cm$^2$ or higher. At the low end, there generally will be observed a minimum flux below which the degree of photochemical etching will be too low to achieve satisfactory selectivity.

Of course, any appropriate source of the necessary photons can be utilized. In general, laser radiation is preferred; however, other high intensity sources can also be very useful. Furthermore, irradiation can be applied to the material surfaces in patterned, imaged form whereby photopatterning of semiconductor materials can be effected in accordance with this invention utilizing the conventional optical imaging systems and techniques which are so highly conventional in semiconductor device fabrication.

The duration of the etching treatment will be selected to achieve an etch of the desired depth. Appropriate times can readily be determined in accordance with routine preliminary experiments which will be application specific. Reference is made to the examples herein. For example, a depth as large as 1 um was achieved in a ½ hour etching experiment in GaAs using a laser radiating at 514 nm and having an intensity of 2000 W/cm$^2$. As another example, under reaction conditions where p-GaAs photochemical etching occurs to a depth of 9000 Å, no detectible etching is observed for n-GaAs in accordance with this invention.

The parameter generally utilized in accordance with this invention to effect the actual control over the selective etching process is the bias voltage applied to the semiconductor materials. The precise voltage is not critical and can be up to several hundred volts. The upper limit is determined by the point at which the voltage becomes incompatible with other requirements of the etching system. Typically, the upper limit is determined by the need to avoid the formation of a plasma directly above the semiconductor materials. Generation of the bias voltage, of course, is highly conventional for semiconductor materials.

The polarity and strength of the bias voltage are preferably used to determine the selectivity of etching for the given application. Utilizing the principles of this invention, for example, a p-type semiconductor material can be selectively etched in the presence of an n-type material which remains unetched. Under these circumstances, the materials are biased negatively. It has been determined that such a bias voltage effects a sufficient degree of the necessary band-bending at the surface of the materials to suppress etching in the n-type material. Because the band-bending phenomenon is so highly correlated with the ambient conditions to which the material surface is exposed, as well as to most of the other operational parameters, it was not possible a priori to predict that the bias voltage would be able to control the underlying electronic phenomena in the manner necessary to achieve selective etching in accordance with this invention. For example, in surfaces exposed to a vacuum, sufficient band-bending is not observed.

Where it is desired selectively to etch n-type material with preference over p-type material, the polarity of the bias voltage will be reversed. The semiconductor materials will be made positive. In either situation (selective n- or p-etching), the voltage strength necessary to achieve the selective etching will be routinely determined in conjunction with simple preliminary experiments, especially in view of the details discussed herein.

Not only can selectivity be based upon dopant type but, as mentioned above, it can be based upon dopant concentration. As a result, n-type materials of low or moderate carrier concentrations can be selectively etched in the presence of materials having higher carrier concentrations. The same is true for selective etching of low or moderately concentrated p-type materials in the presence of high concentration p-materials. For the n-case, the materials will be biased negatively; for the p-case, the materials will be biased positively. A given voltage will permit selective etching in materials having carrier concentrations below a given level and will essentially preclude etching in materials having concentrations higher than this level. In some cases, this "level" will be defined by a range of continuous concentration levels; in others, it will be more sharply defined.

Alternatively, for materials having a given difference in carrier concentration, a voltage can routinely be determined which will discriminate between the two, permitting etching in the lower concentration material and essentially precluding it in the higher concentration material. In general, for n-type materials, a shift of a few volts more negatively (e.g., a shift from about $-360$ volts to about $-400$ volts) will shift the concentration level above which etching will essentially not occur from, e.g., about $2 \times 10^{17}/cm^3$ to about $1 \times 10^{17}/cm^3$ in n-GaAs under conditions equivalent to those of the examples of this invention. The corresponding effect will be observed by shifting to more positive voltages in p-type materials. Determination of appropriate voltage levels in a given case can be accomplished routinely in conjunction with preliminary experiments.

Utilizing the principles of this invention, in theory, conditions can be selected to descriminate between materials varying in carrier concentrations by very low degrees, heretofore unachievable. Factors on the order of at least 2–3 are applicable, or even lower.

In the foregoing, when the semiconductor material is grounded, photochemical etching will ensue irrespective of dopant-type or concentration. For n-type material, positive biases will result in photochemical etching irrespective of n-concentration. However, negative biasing will effect the desired selectivity in accordance with the foregoing principles. For p-type material, negative biasing will result in photoetching irrespective p-concentration. Positive biasing will enable utilization of the foregoing principles to achieve selective photoetching as a function of p-carrier concentration.

The etching depth, in essence, is controlled by the total radiation fluence in a given experiment. The latter, of course, can be routinely controlled by controlling radiation flux and/or duration under otherwise constant conditions.

The degrees of selectivity achievable by this invention will vary from system to system. In general, high degrees of selectivity will be achievable, e.g., greater than 20:1, for dopant concentrations differing by as little as the factors mentioned above. Where the factors are larger, selectivities often will be larger. Experiments have shown that for dopant concentrations differing by as little as a factor of 5, selectivity greater than the mentioned 20:1 ratio is readily achieved. As another example, under conditions where $2\times10^{17}/cm^3$ n-GaAs is etched to a depth of greater than 2000 A, $1\times10^{18}/cm^3$ n-GaAs is etched to a depth of less than 100 A.

As can be seen from the foregoing, when utilizing the details of this invention in conjunction with imaged radiation, semiconductors can be photopatterned under very desirable conditions. For example, photoresists can be eliminated. The resolution of such photopatterning in accordance with this invention is essentially only optically and electrically limited, i.e., due to the defraction limit and/or broadening caused by underlying electronic mechanisms ongoing in the semiconductors' surface, e.g., carrier diffusion mechanisms.

In a typical configuration for carrying out the method of this invention, the sample is situated downstream of a plasma cell. The latter is conventionally operatively associated with reactant gas sources. The plasma cell is used to generate reactive Cl species (e.g., Cl• and Cl$^-$) from conventional Cl-containing gases, including $Cl_2$, HCl, $CH_{4-x}Cl_x$, where x is 1-4, or other compounds which decompose to produce the mentioned active species in a plasma. Generally, a dc plasma is generated between parallel plates. Of course, alternative plasma generation techniques can also be utilized to provide the reactant source, e.g., rf, cold cathode techniques, etc. Where plasmas are not needed to generate the necessary gaseous reactants, of course, the plasma cell can be eliminated. The active species reactants then flow past the sample chamber to a conventional pumping system which creates the flow.

As discussed above, the system parameters are selected so that the Cl-species or other etchant-species concentrations are maintained sufficiently low to produce negligible non-photochemical etching of the substrate, i.e., they are chosen to produce negligible etching in the absence of photons in comparison with the amount of photochemical etching which is achieved. The sample chamber is conventionally configured with means for irradiating the sample with a conventional photon source. As also discussed above, regardless of doping level, the substrate will exhibit etching only in the regions illuminated with bandgap or higher energy photons under the appropriate balance of photon flux and reactive etchant species concentrations. The voltage similarly will be selected in accordance with the principles discussed above. That required in a given case to produce the necessary selectivity will depend on the conductivity of the gas in the region of the sample, the specific dopant concentration of the more heavily doped material, etc.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever. In the preceding text and the following examples, all temperatures are set forth uncorrected in degrees Celsius and all parts and percentages are by weight; unless otherwise indicated.

The disclosures of certain publications of the inventors are incorporated by reference herein, viz., Ashby, Appl. Phys. Lett. 45 (8), Oct. 15, 1984, 892; Ashby, Appl. Phys. Lett. 46 (8), Apr. 15, 1985, 752; and Ashby et al., Appl. Phys. Lett. 47 (1), July 1, 1985, 62.

EXAMPLE 1

The samples were GaAs (100) from Crystal Specialties, Inc. No pretreatment to remove native oxide was employed. Carrier concentrations of $4.5\times10^{17}/cm^3$ and $7\times10^{17}/cm^3$ were measured for the Si-doped n-GaAs and Zn-doped p-GaAs, respectively. Reactions were run at a sample temperature of 370 K., unless otherwise specified, to facilitate evaporation of reaction products. The gas-phase Cl reactants were generated in a dc plasma located 10 cm upstream from the sample. The plasma electrodes were 316 stainless steel discs of 2.5 cm diameter separated by 1.0 cm. Voltage between the discs was $-370\pm5$ V, with an interelectrode current of 0.6 mA. Since moderate concentrations of Cl radicals and ions will etch GaAs in the absence of light, the Cl species concentrations were reduced to a level where no etching was detectable with a Dektak profilometer in the absence of light of energy greater than the bandgap of GaAs. This was achieved by dilution of HCl with He since a minimum pressure of nearly 1 Torr was required to sustain a glow discharge. The gas mixture employed was 3.00 Torr He with 0.11 Torr of 5% HCl in He. The He flow rate was 510 sccm, which corresponds to a mean velocity of 250 cm/s. Reactions were run for 1800 s. Although actual Cl species concentrations were not measured directly, the same pressure and plasma conditions were used for all runs to ensure the same supply of Cl reactants and, consequently, self-consistent reaction conditions for all measured etch rates.

The photon source was a focused Ar$^+$ laser operated at 514.5 nm in the TEM$_{oo}$ mode. The beam dimensions were measured with a Reticon photodiode array with 25 μm resolution. The array was located at a position in the optical setup which corresponded to the sample surface. The beam was Gaussian with full width at half-maximum $=150\pm25$ μm. The laser power was set at a constant value and the power on the sample surface was varied by insertion of neutral density filters into the optical path. Laser power at the sample surface was varied from 0.056 to 0.22 W.

Etch profiles were measured with a Dektak profilometer. Etch rates were defined by the maximum etch depth measured at beam center for a 1800-s reaction. These rates do not represent the maximum rate possible, since no attempt was made to optimize reaction conditions.

Typical etch profiles showed a smooth Gaussian-shaped hole, which replicates the laser beam profile, etched in the GaAs sample. Extremely smooth holes are produced by this photoetching technique. This contrasts sharply with the rough holes produced by laser-assisted thermal etching. The etch depths produced by varying laser power were also measured for both p-GaAs and n-GaAs. For both dopant types, etch depth increases linearly with laser power. For a constant laser power, etch depth increases linearly with time with an intercept at zero, indicating that the initial presence of the thin layer of native oxide does not inhibit the photoreaction to any significant extent.

One would expect a purely photochemical reaction to exhibit linearity in laser power since the number of electron-hole pairs produced is proportional to the photon flux, which is determined by the laser power for constant beam dimensions. In fact, such linearity is observed. One would also expect to observe a dependence on laser power for a purely thermal reaction. However, this dependence in the thermal case would not be linear but, rather, would depend exponentially on the temperature rise induced at the GaAs surface for a given laser power. One may calculate the temperature rise at the surface of a material induced by a Gaussian laser beam of known profile and power. Neglecting power losses due to reflectance at the GaAs surface, the maximum calculated temperature rise at beam center for a laser power of 0.22 W is 26°, while a laser power of 0.056 W produces a maximum rise of 7°. An Arrhenius plot of the natural log of the experimental etch depths at beam center versus the reciprocal temperature of the sample was constructed. Two sets of data points represented the difference in temperature calculated assuming a reflectance of 0.0 or 0.39. The actual temperature of the samples should lie somewhere between these extremes. The plots made clear that marked curvature is present regardless of the actual value of the reflectance. Therefore, the Arrhenius behavior expected of a thermal process is absent in this photoinduced reaction. A study of the temperature dependence of the thermal reaction in a planar plasma reactor using $Cl_2$ as the source of reactive Cl species showed Arrhenius behavior over the temperature range from 490 to 580 K. with an experimental activation energy of 10.3 kcal/mole (Donnelly, et al., *J. Electrochem. Soc.* 129, 2533 (1982)). The expected temperature dependence of the etch depth if the laser were only increasing the thermal reaction rate was calculated. The lack of fit to the experimental etch depths is clear evidence of the existence of a nonthermal reaction mechanism. As a further test of the apparent temperature independence of the photoreaction, two samples of n-GaAs with carrier concentration of $1 \times 10^{18}/cm^3$ were heated to 361 and 384 K. and reacted under a laser power of 0.18 W, which gives a calculated maximum temperature rise of 21° to 382 and 405 K., respectively. This serves to simulate the calculated maximum temperature range for the samples reacted at different laser powers (377-396K.). The measured etch rates for the samples at 361 and 384 K. were 4700±300 Å and 4850±100 Å, respectively. Thus, it is clear that the laser is not increasing the reaction rate of GaAs by merely heating the surface and thereby facilitating a thermally activated reaction. Although such purely photochemical effects have not been observed before in a dry etching process for GaAs, the laser-assisted formation of GaAs oxide under similar low power density laser radiation also appears to be photochemical rather than thermal in origin.

This example shows that GaAs exhibits greatly enhanced reactivity with gas-phase Cl species when the surface is irradiated with low-intensity laser light where the photon energy is greater than the bandgap of GaAs. The dependence of this reaction on laser power and temperature is inconsistent with a thermal process. Rather, the reaction of electron-hole pairs by laser irradiation induces a truly photochemical reaction of GaAs with the reactive gas-phase Cl species. This is the first observation of a purely photochemical dry etching process in a III–V semiconductor material.

EXAMPLE 2

The experimental apparatus and procedures employed in Example 1 were used here. The samples were GaAs(100). The $2.5 \times 10^{16}$ and $1.5 \times 10^{17}/cm^3$ Sn-doped n-GaAs were grown by liquid phase epitaxy (LPE). The $2.5-5 \times 10^{17}/cm^3$ n-GaAs (n+-GaAs) and $7-9 \times 10^{18}/cm^3$ p-GaAs (p+-GaAs) were from Crystal Specialties, Inc. Carrier concentrations were measured by a C-V technique using a Miller feedback profiler following deposition of Al contacts. Reactions were run at 370 K. for 1800 s with samples located 10 cm downstream in the flowing afterglow of a reactant gas mixture of 0.2% HCl in He with a total pressure of 3.3 Torr. Voltage and current between the discharge electrodes were −410±5 V and 0.6 mA. Attempts to measure the flux of charged particles to the sample holder using an electrometer in the current mode showed that no measurable net current of charged particles reached the sample. A focused Ar+ laser provided a Gaussian profile beam at 514.5 nm with full width at half-maximum of 150±25 μm at the sample. The energy of these photons is insufficient to produce a single-photon dissociation of HCl and the flux is too low to produce appreciable multiphoton dissociation. The absence of significant photogenerated Cl is evidenced by the total lack of etching under illumination if the plasma is not simultaneously fired upstream from the sample. Thus, the principal etchant appears to be neutral Cl atoms generated upstream from the sample by the plasma discharge. Etch rates are defined by the etch depths measured at the center of the resulting Gaussian shaped holes using a Dektak profilometer. No attempt was made to optimize gas flow rates, gas composition, or discharge conditions to maximize etch rates.

The etching of n+-GaAs can be totally suppressed by application of an appropriate negative bias voltage to the sample under conditions which produce undiminished etching of p+-GaAs. Only a small, but undetermined, fraction of the total bias voltage is dropped within the semiconductor, as will be discussed later. For voltages less negative than the shut-off voltage for n+-GaAs, $V_{off}$, the etch depth is relatively constant for both materials. The shut-off threshold is extremely sharp. A voltage change of less than 0.2 V (less than 0.1% of the total applied voltage) can reduce the etch depth for n+-GaAs from more than 8400 Å to zero. By comparison, at $V_{off}$ for n+-GaAs, p+-GaAs continues to etch to a depth of 9000 Å.

Furthermore, the etching of n+-GaAs is suppressed by a negative bias at which etching of lower doping level n-GaAs continues undiminished. Etching rates are comparable able for all three samples until $V_{off}$ for n+-GaAs is reached. A change in applied voltage of less than 0.1% reduces the etch rate of n+-GaAs more than 20-fold. However, at $V_{off}$ for n+-GaAs, etching of n-GaAs with lower doping levels continues undiminished, producing greater than 20:1 selectivity with less than a five-fold difference in doping level. Doping levels differing by a factor of 1000 were required in a previously studied wet photochemical etching process for n-GaAs to produce similar selectivity. Doping level selectivity for Si required a factor of 100 difference for comparable selectivity. (See foregoing.)

Dry etching of GaAs proceeds by the oxidative decomposition of GaAs through the formation of $GaCl_3$ and $AsCl_3$. For this to occur, the positions of the redox potentials for the reduction and oxidation reactions responsible for decomposition must be appropriate relative to the band positions of the semiconductor. Determination of the relative positions of the appropriate energy levels is very difficult in the gas-solid case. The GaAs (100) surface exhibits a range of surface structures. Between the As-rich (1×1) and the Ga-rich c(8×2) structure, eight different surface structures have been identified; their corresponding work functions for the clean surface oscillate between 4.82 and 5.15 eV. In addition, chemisorption of gases can alter the work function through both the band bending and the ionization potential. For clean surfaces, Fermi level pinning caused by a high density of in-gap surface states, presumably due to defects, has been reported for both n-type and p-type GaAs (100). The surface in the presence of the HCl/He flowing afterglow is not "clean" and may reconstruct. Adsorption of Cl may change the density of defect-related surface states, resulting in "unpinning" of the Fermi level. These uncertainties regarding the condition of the surface and its consequences for the semiconductor energy levels preclude quantitative estimation of the relative positions of important energy levels. The voltage-dependent behavior discussed below provides qualitative insight, however.

For the oxidative decomposition of GaAs to proceed, both the reduction of Cl to Cl$^-$ and the oxidation of Ga and As from formally Ga$^0$ to As$^0$ to Ga(III) and As(III) must occur at the same GaAs surface to produce volatile GaCl$_3$ and AsCl$_3$. An insufficient supply of either electrons or holes at the semiconductor surface can suppress the reaction through a kinetic effect. In the absence of bandgap light, the surface will be much richer in one carrier type. Few holes are available at the n-GaAs surface to drive the oxidation of Ga$^0$ and As$^0$. Similarly for p-GaAs, few electrons are available to drive the reduction of Cl. Therefore, half of the reaction required for etching is kinetically limited in each material. Under bandgap illumination, photogeneration of electrons and holes in the surface region of the semiconductor provides sufficient carriers of both types to produce the observed photoetching. However, the quantum yield for this reaction is quite low ($10^{-5}$–$10^{-6}$) under the mentioned reaction conditions, indicating most of the photogenerated carriers are lost by some other process, such as recombination, before participating in the etching reaction. A similar mechanism has been proposed for the photoetching of Si by XeF$_2$. This similarity of mechanism is highly suggestive that similar bias-voltage control of Si photoetching should be possible.

The origin of the selective etching of p$^+$-GaAs and of lower doping level n-GaAs at a voltage bias which suppresses etching of n$^+$-GaAs may be explained by the factors which influence the direction of carrier flow relative to the surface. In the absence of external bias, the direction and degree of band bending is determined by the type and occupation of states at the surface. Insufficient information is available to identify which states dominate the band bending. However, the voltage-dependent behavior can be explained if electron acceptor states dominate on the n-GaAs surface, producing an inversion or depletion layer. The associated band bending lowers the bulk band energies relative to the surface band edges. The resultant potential barrier in n-type material is described by Eq. (1)

$$\phi = eN_s^2 / 2\epsilon N_d.$$

$N_d$ is the donor concentration and $N_s$ is the concentration of occupied electron acceptor states below the Fermi level of the semiconductor. This potential varies with doping level if the bulk Fermi levels for different doping levels are above the energy level for these surface states and are not pinned; greater band bending occurs at lower doping levels. The band bending facilitates hole migration to the surface, and the resultant hole current to the surface can facilitate the oxidative portion of the etching reaction; i.e., the formation of Ga(III) and As(III) from Ga(O) and As(O). When the negative bias voltage is applied, the Fermi level is raised relative to the surface band edge. This decreases the potential difference between the bulk band position and the surface band edge; i.e., flattens the band by an amount which is proportional, but not equal, to the applied voltage. The initial potential difference between the bulk band and the surface band edge will be less for more heavily doped n-GaAs due to the lesser band bending present before application of a bias voltage. Therefore, a less negative voltage is required to switch n$^+$-GaAs from inversion or depletion into an accumulation mode. As long as the band bending facilitates hole migration to the surface, the negative voltage does not impede the etching reaction and the etch rate is independent of doping levels. However, when sufficient negative bias is applied to produce a barrier to hole migration toward the surface by producing a flat band or an accumulation layer in n$^+$-GaAs, suppression of the etching reaction occurs. Since the crossing of this threshold will occur at a less negative applied voltage for n$^+$-GaAs than for less heavily doped n-GaAs, one can shut off the etching of the most heavily doped GaAs at a negative bias voltage which permits etching of less heavily doped n-GaAs to continue. This proposed mechanism is not intended to limit the scope of this invention in any way.

Only a small fraction of the large applied negative bias voltage is dropped within the semiconductor near-surface region. Most will drop across the low conductivity afterglow. An addition fraction will drop at the sample-holder interface. It appears that the voltage fraction affecting the n-GaAs band bending is less than $10^{-3}$ of the total applied voltage since the surface potential barrier in the n$^+$GaAs should be less than 0.3 V before application of the bias voltage.

The continued etching of p$^+$-GaAs at voltages more negative than the n$^+$-GaAs shut-off voltage is consistent with the proposed mechanism since the band bending for the two dopant types is frequently in opposite directions under the same ambient conditions. However, the band bending under our reaction conditions cannot be predicted a priori.

An equivalent aspect of this invention involves use of its principles to control the photochemical dry etching of one of the semiconductor materials in the absence of the other material, e.g., by appropriately controlling the bias voltage, photon parameters, etc.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A method of selectively photochemically dry etching a first semiconductor material of a given composition in the presence of a second semiconductor material which is of a composition different from said first material, said second material substantially not being etched during said method, comprising subjecting both materials to the same photon flux of an energy greater than their respective direct bandgaps and to the same gaseous chemical etchant under conditions where said etchant would be ineffective for chemical etching of either material were the photons not present, said conditions also being such that the resultant electronic structure of the first semiconductor material under said photon flux is sufficient for the first material to undergo substantial photochemical etching under said conditions and being such that the resultant electronic structure of the second semiconductor material under said photon flux is not sufficient for the second material to undergo substantial photochemical etching under said conditions.

2. A method of claim 1 wherein said conditions include a bias voltage applied to each of said materials, the bias voltage being of a polarity and strength whereby said first semiconductor material is etched and said second semiconductor material is not etched.

3. A method of claim 2 wherein the compositions of the two materials differ primarily by carrier type, one being n-type and the other p-type.

4. A method of claim 3 wherein said first etched semiconductor material is of p-type, said second non-etched semiconductor material is of n-type and said bias voltage has a negative polarity in said second semiconductor material.

5. A method of claim 4 wherein each of said materials is GaAs.

6. A method of claim 3 wherein said first etched semiconductor material is of n-type, said second non-etched semiconductor material is of p-type and said bias voltage has a positive polarity in said second semiconductor material.

7. A method of claim 3 wherein said semiconductor materials have the same III-V chemical composition except for dopant characteristics.

8. A method of claim 2 wherein said semiconductor materials have the same chemical composition except for dopant characteristics.

9. A method of claim 2 wherein said semiconductor materials have the same III-V chemical composition except for dopant characteristics.

10. A method of claim 9 wherein each of said materials is GaAs.

11. A method of claim 2 wherein each of said materials is of the same type, n- or p-, but have different primary carrier concentrations.

12. A method of claim 11 wherein each of said materials is of n-type, said first material having a lower n-concentration than said second material, and said bias voltage having a negative polarity in the second semiconductor material.

13. A method of claim 12 wherein said semiconductor materials have the same III-V chemical composition except for dopant characteristics.

14. A method of claim 11 wherein each of said materials is of p-type, said first material having a lower p-concentration than said second material, and said bias voltage having a positive polarity in the second semiconductor material.

15. A method of claim 11 wherein said semiconductor materials have the same chemical composition except for dopant characteristics.

16. A method of claim 11 wherein said semiconductor materials have the same III-V chemical composition except for dopant characteristics.

17. A method of claim 16 wherein each of said materials is GaAs.

18. A method of claim 11 wherein the carrier concentrations of the two materials differ by a factor of 3 or less.

19. A method of claim 11 wherein each of said materials is silicon.

20. A method of claim 2 wherein said photon flux is initiated on said materials in a preselected, imaged pattern.

21. A method of claim 2 wherein said semiconductor materials are part of the same semiconductor device.

22. A method of claim 2 wherein said semiconductor materials have binary, ternary or quaternary chemical compositions.

* * * * *